United States Patent [19]

Gates

[11] 4,046,985
[45] Sept. 6, 1977

[54] SEMICONDUCTOR WAFER ALIGNMENT APPARATUS

[75] Inventor: Gerald Alan Gates, Jericho, Vt.

[73] Assignee: International Business Machines Corporation, Armonk, N.Y.

[21] Appl. No.: 526,989

[22] Filed: Nov. 25, 1974

[51] Int. Cl.$^2$ .............................................. B23K 26/00
[52] U.S. Cl. ................................. 219/121 L; 29/56.6; 83/6; 225/2
[58] Field of Search .... 219/121 LM, 121 L, 121 EM, 219/121 EB; 29/DIG. 44, DIG. 52, 203 R, 203 P, 203 V, 413; 83/6; 225/2, 96.5; 269/21, 56

[56] References Cited

U.S. PATENT DOCUMENTS

| | | | |
|---|---|---|---|
| 3,165,818 | 1/1965 | Soffa et al. | 29/203 V X |
| 3,626,141 | 12/1971 | Daly | 219/121 L |
| 3,811,182 | 5/1974 | Ryan, Sr. et al. | 29/203 V X |
| 3,816,700 | 6/1974 | Weiner et al. | 219/121 L |
| 3,824,678 | 7/1974 | Harris et al. | 219/121 L X |
| 3,851,758 | 12/1974 | Makhijani et al. | 29/203 V X |

Primary Examiner—Bruce A. Reynolds
Attorney, Agent, or Firm—Francis J. Thornton

[57] ABSTRACT

An apparatus for treating a wafer of semiconductor material so that individual devices which may be simple devices or complete complex integrated circuits defined on the front surface of the wafer can be easily separated from the wafer. The apparatus aligns the wafer to a fixed reference position, inverts the aligned wafer to expose its backside and transfers it with controlled motion to a set position under a laser beam apparatus. The laser beam scans the backside of the wafer to create in the kerf area between each of the devices an easily fractured region. While maintaining the wafer alignment the laser treated wafer may be transferred to a flexible pressure sensitive tape tensioned across the frame which maintains the wafer alignment. The wafer, while on the frame can be tested, fractured into respective individual devices, and selectively removed from the tape.

10 Claims, 3 Drawing Figures

4,046,985

SEMICONDUCTOR WAFER ALIGNMENT APPARATUS

BACKGROUND OF THE INVENTION

This invention relates generally to an apparatus for treating the semiconductor wafer so that individual units which may be single devices or complex integrated circuits can be easily separated from the semiconductor wafer in which they are formed. More particularly, the invention relates to an apparatus that aligns a semiconductor wafer to a fixed reference and emits an aligned laser beam to traverse the reverse side of the wafer such that easily fractured regions can be created in the region of the wafer traversed by the laser beam.

Methods and apparatus for dividing semiconductor devices from monolithic wafers and sorting the semiconductor devices are known. One such apparatus shown in U.S. Pat. No. 3,583,561 tests each device in a wafer optically, encodes the test data, and prepares a photographic record thereof. After testing the wafer is mounted on a pressure sensitive web together with the coded photographic record and the wafer broken to separate the respective devices. By reading the coded record, output signals can be utilized to pick each of the separated devices from the web and placed into a preselected station with devices of common characteristics. Unless great care is taken in mounting the photographic record and the wafer significant discrepancies in the removal of the selected devices will occur.

It is also known that substrates can be aligned prior to laser dicing as is taught in U.S. Pat. No. 3,816,700. This patent discloses the alignment of a wafer with its active face up, in a portable vacuum chuck that will hold the aligned wafer in a set position. Once the wafer is aligned the portable vacuum chuck is then transferred to a holding device which can be placed under a laser scribing apparatus which scribes the active face of the aligned wafer with a laser beam in accordance with the preset alignment. The action of the laser beam in dicing the wafer creates a residue on the face of the wafer which can interfere with the subsequent handling and mounting of the diced units.

To avoid this, the concept of laser dicing from the backside of the wafer away from the active units are considered. Such cutting of semiconductor wafers from the reverse side with the laser beam is taught in U.S. Pat. No 3,824,678 which teaches that a wafer can be aligned in an inverted position by using an infrared microscope and subsequently dicing the wafer. Such infrared microscopes have poor resolution thus requiring that the units to be separated from the wafer be created further apart in the wafer so that the poor infrared resolution can be compensated for. Additionally such infrared microscopes are complex, difficult to use, and expensive to purchase. Also they do not permit direct viewing of the semiconductor wafer surface.

Accordingly, the present invention which describes a complete system for the dicing of individual semiconductor units from an integral wafer avoids the difficulties and disadvantages encountered by these prior art systems.

SUMMARY OF THE INVENTION

Broadly speaking the complete system of the present invention provides for aligning an integral wafer containing such units defined in the front surface thereof to a fixed orientation and exposing the reverse or back surface of the water to a laser beam such that an easily fractured region can be created in the wafer between each of the units to be separated and removed from the integral wafer.

The invention further provides for the laser treated wafer to be mounted on a pressure sensitive tape stretched across a receiving frame so that it again can have its front side exposed for testing after the laser dicing has occurred. While still mounted on the tape, the wafer may be fractured into individual units and placed in a suitable transfer machine where units of like characteristics can be selectively removed from the tape and transferred to suitable receptacles.

The present invention by dicing the semiconductor wafer from the reverse side thereof, not only permits denser packing of the circuits or devices created on the wafer but also avoids distribution of undesirable residues on the front or active face of the unit.

It is, therefore, an object of the invention to describe a complete system for the laser dicing of a monolithic semiconductor wafer in which the orientation of each of the units defined in the wafer is aligned to a fixed position and maintained in that relationship during dicing, testing, and sorting.

It is another object of the present invention to describe an apparatus which aligns a semiconductor wafer, inverts it, and exposes its reverse side to a laser beam which laser beam defines in the material between the semiconductor units an easily fractured region. The laser treated wafer may be then mounted on a tape so that it may be maintained as a single entity until it is tested.

It is still another object of the invention to teach an integrated system adapted to align a semiconductor wafer into a preferred orientation during the transfer of the wafer through a dicing station and subsequent operations.

It is still a further object of the invention to teach a method of treating the nonactive backside of semiconductor wafer with a laser beam such that damage of contamination to the front side of the wafer in the area treated by the laser beam is avoided or eliminated.

DESCRIPTION OF THE DRAWINGS

These and other features of the present invention will be more fully understood from the accompanying drawings in which.

DETAILED DESCRIPTION OF THE INVENTION

Figure 1:
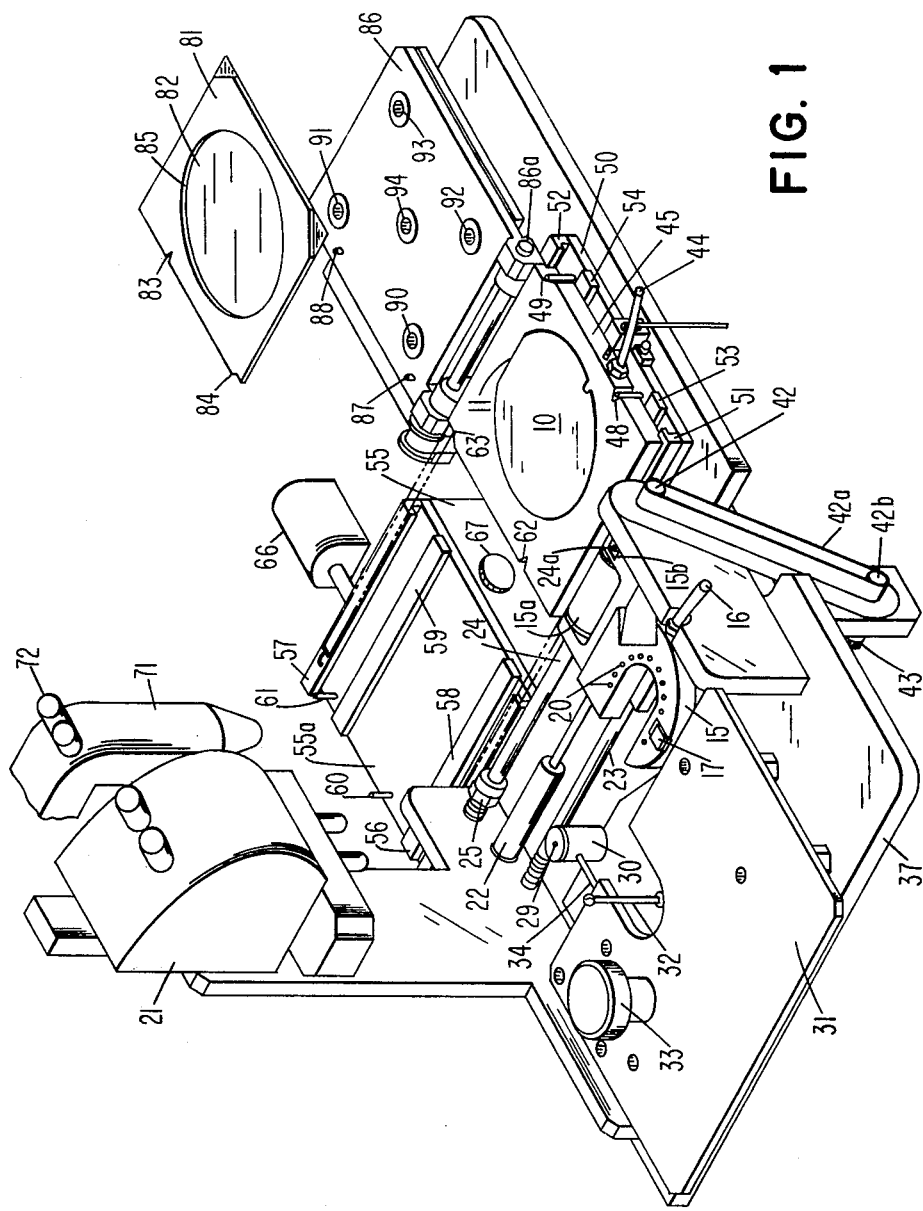
FIG. 1 is an isometric view of an apparatus that aligns, inverts, laser dices, and mounts the wafer to a carrier for further handling.
Figure 2:
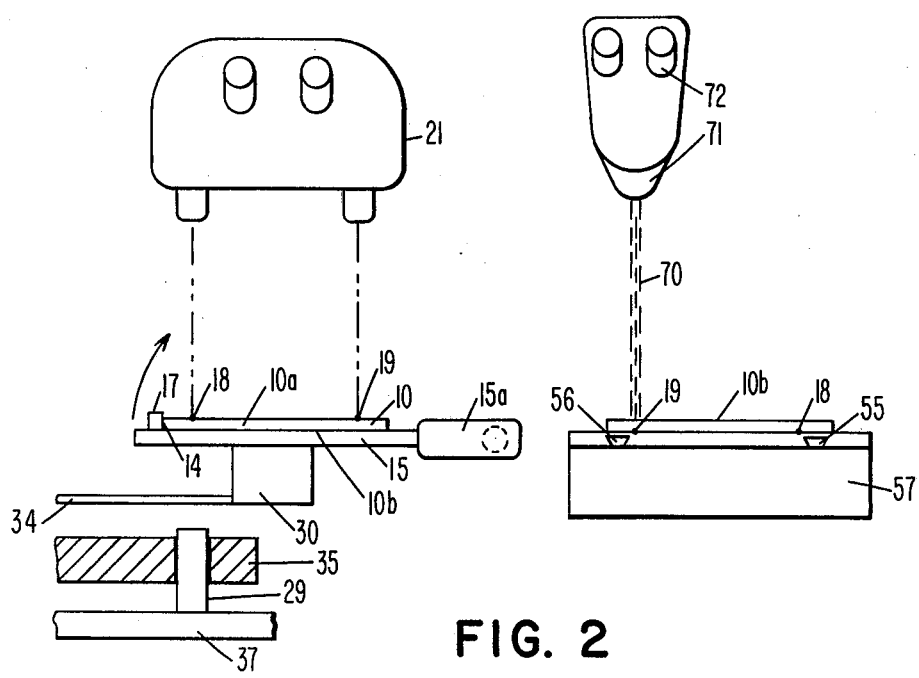
FIG. 2 illustrates schematically the aligning, inverting, and laser dicing steps of the present invention.

In describing the apparatus of the invention reference will be made to each of the FIGS. 1, 2, and 3. To initially set up the apparatus shown in FIG. 1 such that it will be repetitive with a high degree of accuracy, it is necessary to place a transparent wafer or a mask 10, as shown in FIG. 2, on the water prealigner vacuum chuck 15. The body of this mask is made of a material such as glass which is transparent to visible light. The mask was formed on its top surface 10a an exact photographic duplicate of the semiconductor devices as they are formed in the wafer to be diced in the apparatus.

For a number of reasons not pertinent to the present invention semiconductor wafers are usually provided with a flat edge which is parallel to one of the major crystallographic axes in the wafer. During the manufacture of semiconductor devices in the wafer, care is taken to assure that these devices are positioned with respect to this flat edge. Also it should be noted that in the formation of such devices, they are formed in the wafer such that one set of two mutually orthogonal sets of kerf regions, separating the devices from each other, is substantially parallel to the edge. Also at least one pair of alignment marks are provided on the wafer surface with the devices. Usually each such alignment mark is placed in a respective intersection of such kerf regions to define the intersection and aid in the exact positioning of such wafers during their manufacture.

Because this flat edge exists on the wafer to be diced, the mask 10 is also provided with such a flat edge 14. The chuck 15 takes advantage of this flat edge 14 and to do so is provided with a stop 17 against which the edge 14 may be butted. Because the mask 10, as shown in FIG. 2, is a duplicate of the wafer to be diced it is provided with a pair of widely separated alignment marks 18 and 19.

Once the mask 10 is mounted on the chuck 15 a vacuum is drawn through hose 16 and ports 20 by a suitable apparatus (not shown) to hold the mask in a fixed position on the chuck 15. While the mask is so held on the chuck 15, the chuck 15 is pulled, with a hydraulic piston 22, along a pair of parallel rails 23 and 24 to a set position under a split image microscope 21. At least on of the rails, in this case rail 24, is provided with an adjustable stop 25 against which the chuck is always pulled by the piston 22. This stop 25 assures that the chuck always goes to the same fixed position under the microscope 21. As the vacuum chuck 15 is drawn in under the microscope 21 the back surface 10b of mask 10 is brought into contact with a rotatable, x and y adjustable, alignment pedestal 30. Once the pedestal 30 is contacting the back of the mask 10a a vacuum is drawn through a central opening 29 in pedestal 30 and the vacuum on chuck 15 is released so that the wafer is now held only by the pedestal. The wafer is now aligned to a suitable reticle (not shown) which is provided in the microscope 21 by rotating the pedestal 30 and adjusting it in the x and y direction. The x-y adjustment is made by manipulating a joy stick 32 while the rotational adjustment is made by knob 33.

Figure 3:
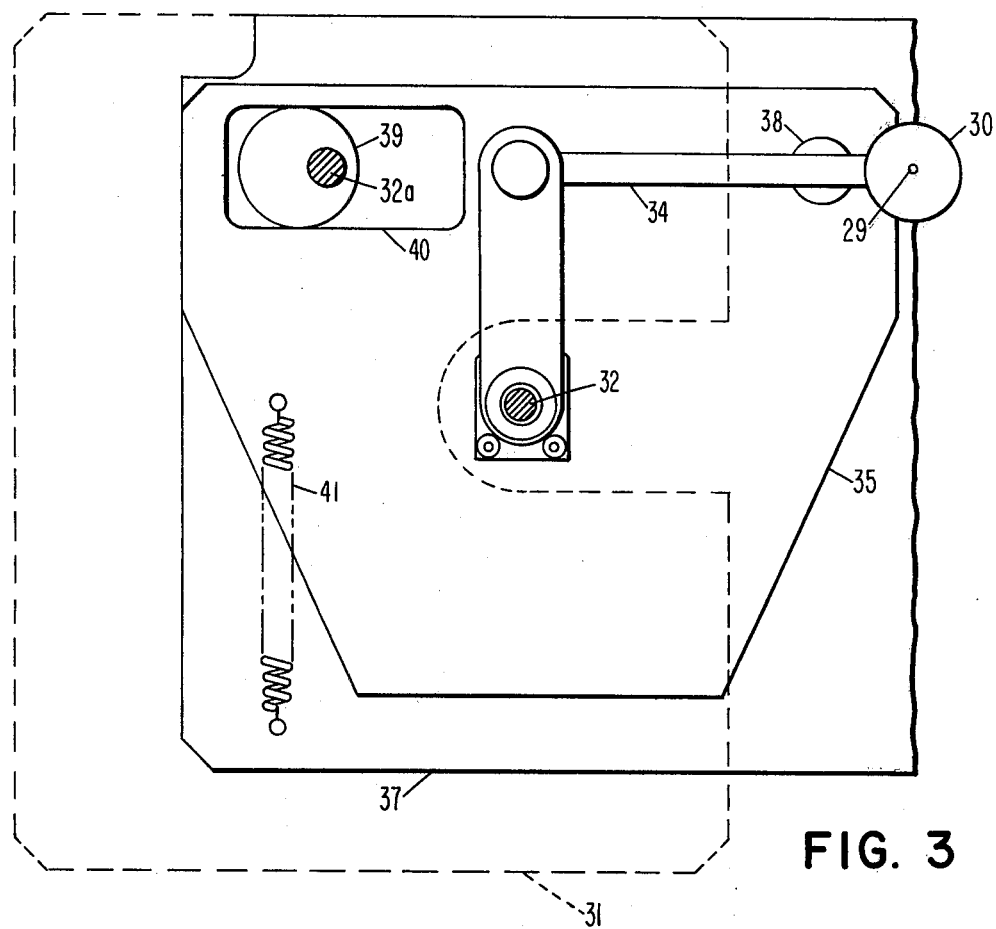
FIG. 3 illustrates in detail the alignment portion of the apparatus of FIG. 1.

This pedestal adjustment mechanism lies beneath the cover plate 31 and is shown in greater detail in FIG. 3. The pedestal 30 is connected by an L-shaped arm 34 to the joy stick 32 which is secured to a pivotable plate 35. The plate 35 pivots with respect to a base plate 37, around a post 38 secured to the base plate 37. The plate 35 is also provided with a rectangular opening 40 in which there is positioned a circular cam 39 which is mounted off center with respect to the shaft 33a extending up to knob 33. A spring 41 connected between the base plate 37 and the pivotable plate 35 applies a positive bias to the plate 35 and draws the plate 35 against the cam 39. Movement of the joy stick 32 causes the pedestal 30 to move in an x or y direction. Rotation of the knob 33 causes the off center mounted cam 39 to be driven around within the rectangular opening 40 which in turn causes the plate 35, and hence the alignment pedestal 30, to be rotated around the post 38.

Once the wafer has been positioned and aligned to the fixed pattern set by the reticle in the microscope 21, the vacuum in the alignment pedestal 30 is broken and the wafer released from the pedestal 30. Simultaneously, the vacuum to vaccum chuck 15 is again activated holding the aligned wafer fixedly against the chuck 15. Once the aligned wafer is again securely fixed on the chuck 15, the chuck 15 is driven from under the microscope back to its original position by the piston 22. As shown in FIG. 2, the rail 24 passes through the center of a hinge portion 15a of the vacuum chuck 15. The hinge portion 15a of the vacuum chuck 15 is provided with a slot 15b that will, when the chuck is driven back to its original position, engage a pin 24a in rail 24. This rail 24 is directly coupled to geared pully 42 driven by a belt 42a which passes over another geared pully 42b driven by a rack and pinion mechanism 43. Activation of this mechanism 43 causes the chuck 15 to be rotated around the axis of rail 24 such that the upper surface 10a of the transparent mask 10 is now positioned adjacent a porous dicing vacuum hold down 45. This hold down 45 is in a predetermined loading position butting against pins 46 and 47 which sit in a vee notch 48 and step 49, respectively, provided on one side of the hold down 45. These pins 46 and 47 are set into a guide plate 50 firmly attached to the base plate 37 and act to position the hold down plate 45 in exactly the same position each time it is butted against these pins.

As the face 10a of mask 10 parallels the face of hold down 45 a vacuum is drawn by suitable apparatus (not shown) through hose 44 causing mask 10 to be drawn towards the hold down 45. Simultaneously the vacuum holding the mask 10 on chuck 15 is broken. Thus the mask 10 becomes secured to the hold down 45.

The chuck 15 is now returned back to its initial position by reversing mechanism 43.

Because the mask 10 has been inverted, the front surface 10a of mask 10 is now held against the hold down 45 and the back surface 10b of the mask is exposed. As shown in FIG. 2, the alignment marks are now against the hold down 45.

The guide plate 50 is provided with a pair of edge guides 51 and 52 that engage suitable slots 55 and 56 on the edge of hold down 45. Rails 53 and 54 support the underside of hold down 45 above guide plate 50. Once the mask 10 has been loaded on the hold down 45, the hold down 45 is slid on these guides and rails to transfer it to top 55a of a dicing table 55. This dicing table is also provided with a pair of edge guides 56 and 57 and 58 and 59 which guide and support the hold down 45. On table top 55a the dicing table 55 is also provided with locating pins 60 and 61 which respectively engage vee notch 62 and step 63 on the opposite side of hold down 45 from notch 48 and step 49. These locating pins 60 and 61 serve to assure that the hold down 45 is always in the same place with respect to dicing table top 55a. Once the hold down has been seated against pins 60 and 61, optical axis 70 of the laser head 71 is optically aligned with a first one of the alignment marks 18 or 19 on the transparent mask 10. This is accomplished by viewing the alignment mask through the microscope 72, which is incorporated in the laser head 70, and which has optical axis on the same optical axis as the laser head, and moving the top 55a of the table 55 in the x-y direction with a stepping motor 66 and rotating the table top 55a with knob 67 which drives a screw mechanism (not shown) under table top 55a.

After lining up the first one of alignment marks with the laser axis 70 the table 55 is shifted to the side and the second mark aligned with the laser axis 70, by again adjusting the table top 55a. Once the table top 55a has been properly adjusted such that the laser axis will, when traversed across the mask, travel along the kerf areas and intercept both alignment marks 18 and 19. Thus, any laser beam passing along the axis 70 will act in the kerf area of the wafer as the wafer is shifted under the laser head. The table 55 can be incrementally stepped under the laser beam in both the x and y direction, by the stepping motor 66 so that the laser axis traverses the orthogonal kerf areas. The apparatus of FIG. 1 is now aligned. At this time the hold down 45 is returned to its home position so that notch 48 and step 49 is abutting pins 46 and 47, and the vacuum released such that the mask 10 can be removed.

Because the apparatus is now aligned, any wafer, similar to mask 10, aligned to the retical in microscope 21 will when transferred under the laser head follow a kinetic path, i.e., always go to exactly the same position as did the mask 10 used for alignment of the apparatus.

An opaque semiconductor wafer having alignment marks on its front surface is now placed on vacuum chuck 15 and transferred under microscope 21 and aligned to the reticle therein in exactly the same way the mask 10 was aligned.

Once aligned this opaque wafer is carried by vacuum chuck 15 and the chuck rotated around the rail 24 such that the wafer is inverted on the vacuum hold down 45. Again the vacuum on hold down 45 is activated and the vacuum on chuck 15 broken causing the wafer to be transferred on the hold down 45. When this hold down 45 is now moved under the laser head such that it is firmly seated against pins 60 and 61, it wll be positioned with respect to the laser axis 70 as was the transparent mask 10. The laser can now be activated such that the laser beam passes along the laser axis 70 and impinges on the back side of the wafer. Because the wafer is positioned in exactly the same place the mask 10 was positioned, the laser beam will act only in the kerf regions of the wafer as the table 55 is stepped under the laser beam.

The laser beam is caused to pass over the back surface of the wafer along predefined orthogonal paths which lie in the kerf regions between the integrated circuits disposed in the front surface of the wafer. Preferably the laser beam is of such intensity that the material in the kerf regions, between the units disposed in the wafer, is not fully eroded out of the kerf regions but rather is converted into an oxide of the material of which the wafer is composed. For example, when the wafer is silicon the kerf regions become converted to silicon dioxide.

When the wafer for example is silicon and has a thickness of 0.015 inches than a beam whose intensity is 50 joules erodes away about 40% of this thickness and converts the remaining thickness to silicon dioxide.

Once the laser beam has followed its predetermined paths, the vacuum chuck 45 is withdrawn from beneath the laser head 71 back to its home position such that the notch 48 and the step 49 again abut against the respective alignment pins 46 and 47.

Meanwhile, a frame 81 has been prepared with adhesive coated tape 82 on one side thereof. The frame 81 is also provided with a notch 83 and a step 84. The center of the frame is provided with an aperture 85 which is larger than the wafer on the hold down 45. The adhesive coated tape 82 is applied to the frame 81 such that in the center of the aperature 85 the adhesive coating is exposed. The tape 82 is further disposed across the frame 81 with sufficient tension to assure a deflection of no more than 50 micro inches occurs in the tape in the center of the aperature when a pad ½ inch in diameter is applied to the back side of the tape with a force of 30 grams. The frame 81 carrying the tape 52 is then disposed upon a frame support 86. The frame support 86 has alignment pins 87 and 88 which are adapted to mate with the notch 83 and the step 84 respectively. The frame support 86 is also provided with four vacuum ports 90, 91, 92, and 93 disposed around the four corners of the frame support such that the frame 81 can be securely retained in a fixed position against the frame support and with a central port 94 through which air can be forced. When the vacuum hold down 45 is withdrawn from under the laser head 71 to its home position the frame support 86 is rotationally translated around a hinge 86a in a counterclockwise direction such that the frame 81 is forced against the hold down 45. When the frame support 86 contacts the hold down 45 a pulse of air, passing through port 94, assures that the coated tape 82 is forced against the back side of the laser treated wafer. Simultaneously the vacuum holding the wafer on the vacuum hold down 45 is removed releasing the wafer from the hold down. The wafer now adheres to the coated tape 82. With the release of the wafer from chuck 45 the frame support 86 is lifted off the vacuum chuck 45 and returned to its original position by rotating it in a clockwise direction around the hinge 86a. Once the frame support 86 has returned to this position the vacuum holding the frame 81 to the frame support is released and the frame removed. Because the frame support 86 has reinverted the wafer the front surface of the wafer is again exposed.

The frame 81 keeps the wafer in the aligned position and permits further handling and testing of the wafer without undue breakage.

While the invention has been particularly shown and described with reference to a preferred embodiment thereof, it will be understood by those skilled in the art that the foregoing and other changes in form and details may be made therein without departing from the spirit and scope of the invention.

What is claimed is:

1. An apparatus for separating individual units from a semiconductor wafer opaque to visible light and having first and second major surfaces and first and second reference marks on said first surface comprising,
   - a wafer transparent to visible light and having first and second major surfaces and first and second reference marks on said first surface corresponding to said first and second reference marks on said semiconductor wafer,
   - means for establishing said reference marks on said transparent wafer in a known fixed position,
   - laser means having a given beam axis adjacent said second surface of said transparent wafer,
   - means for viewing said first and second reference marks of said transparent wafer in said known fixed position and aligning said axis relative to said first and second reference marks in said known fixed position,
   - means for replacing said transparent wafer with said semiconductor wafer and for viewing said first and second marks on said first surface of said semiconductor wafer and aligning said semiconductor wafer so said first and second marks on said semiconductor wafer are disposed in corresponding positions with said first and second marks on said transparent wafer in said known fixed position and aligned relative to said axis, and means for traversing a laser beam from said laser means along said second surface of said semiconductor wafer in a known direction relative to said first and second marks on said wafer.

2. An apparatus for dicing a wafer of semiconductor material opaque to visible light, having first and second major surfaces and first and second reference marks on said first surface thereof comprising, a wafer being transparent to visible light and having first and second surfaces and first and second reference marks on said first surface corresponding to said first and second reference mark on said semiconductor wafer, means for establishing said marks on said transparent wafer in a known fixed position, dicing means disposed adjacent said second surface, means for directing a beam of visible light along a given axis at the second surface of said transparent wafer to indicate the position of said dicing means with respect to said reference marks, means for aligning said dicing means with respect to said first and second marks and said transparent wafer by positioning said dicing means with respect to said first and second marks on said first surface in said known fixed position, means for replacing said transparent wafer with said semiconductor wafer so that said first and second marks on said first surface of said semiconductor wafer are disposed in corresponding position with said first and second marks on said transparent wafer in said known fixed position, and means for traversing said dicing means along said semiconductor wafer surface in a known direction relative to said first and second marks on said semiconductor wafer.

3. An apparatus for dicing a semiconductor wafer, opaque to visible light, having first and second major surfaces and first and second reference marks on said first surface thereof comprising, optical means for viewing said marks with visible light reflecting from said first surface, means for aligning said marks with a reference position, dicing means contacting said second surface, means for establishing said dicing means in a known relationship with respect to said optical means and said reference position, and means for traversing said dicing means across said second surface of said wafer to dice said wafer into individual units.

4. An apparatus for dicing a wafer of semiconductor material, said wafer having a plurality of integrated circuits, separated by kerf areas, and a pair of reference marks formed on the front surface thereof comprising, an alignment station, a transfer station, and a dicing station, said alignment station including viewing means for viewing the front surface of a wafer on first and second optical axes and alignment means for aligning the reference marks on the front surface of said wafer to a fixed base line established relative to said optical axes, said transfer station including inverting means for inverting the aligned wafer to expose the back surface of the wafer while maintaining the wafer aligned with reference to said base line and transfer means for transferring said inverted, aligned wafer along a constrained path to said dicing station, said dicing station including, means for maintaining said inverted wafer in said aligned relationship, means for guiding said aligned, inverted wafer to a set position adjacent to and a fixed distance from said alignment station and means for dicing said wafer, said dicing means having a predetermined relationship with respect to said base line so that said inverted, aligned wafer is aligned for dicing on its back surface in said kerf areas, with respect to said base line.

5. The apparatus of claim 4 wherein there is further included means for placing said scribed, inverted aligned wafer on a holding frame and reinverting said aligned wafer to again expose the front surface of the wafer.

6. The apparatus of claim 4 wherein said dicing means comprises a laser emitting a beam having an energy sufficient to convert said wafer in said kerf area into an oxide of said semiconductor material.

7. The apparatus of claim 4 wherein said alignment means includes a rotatable alignment pedestal for holding a wafer under said viewing means and adjustable in the $x$ and $y$ directions.

8. The apparatus of claim 7 wherein said alignment pedestal is affixed to an $x$-$y$ positioning device mounted on a pivot plate, said positioning device adopted to position said pedestal in the $x$ and $y$ directions and said pivot plate adopted to rotationally adjust said pedestal.

9. The apparatus of claim 8 wherein said inversion means includes a vacuum chuck for holding said wafer in an aligned position and rotation means for turning said chuck 180° to invert said wafer.

10. The apparatus of claim 9 wherein there is further provided a vacuum hold down for receiving and holding an inverted aligned wafer.

* * * * *